United States Patent
Choi et al.

(10) Patent No.: US 10,056,477 B1
(45) Date of Patent: Aug. 21, 2018

(54) NITRIDE HETEROJUNCTION BIPOLAR TRANSISTOR WITH POLARIZATION-ASSISTED ALLOY HOLE-DOPED SHORT-PERIOD SUPERLATTICE EMITTER OR COLLECTOR LAYERS

(71) Applicant: Palo Alto Research Center Incorporated, Palo Alto, CA (US)

(72) Inventors: Suk Choi, Palo Alto, CA (US); Christopher L. Chua, San Jose, CA (US); Noble M. Johnson, Menlo Park, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 0 days.

(21) Appl. No.: 15/604,571

(22) Filed: May 24, 2017

(51) Int. Cl.
| | | |
|---|---|---|
| *H01L 29/04* | (2006.01) | |
| *H01L 29/737* | (2006.01) | |
| *H01L 29/08* | (2006.01) | |
| *H01L 29/10* | (2006.01) | |
| *H01L 29/205* | (2006.01) | |

(Continued)

(52) U.S. Cl.
CPC ......... *H01L 29/7378* (2013.01); *H01L 29/04* (2013.01); *H01L 29/0817* (2013.01); *H01L 29/0821* (2013.01); *H01L 29/1004* (2013.01); *H01L 29/2003* (2013.01); *H01L 29/205* (2013.01); *H01L 29/452* (2013.01)

(58) Field of Classification Search
CPC ............ H01L 29/7378; H01L 29/0817; H01L 29/0821; H01L 29/1004; H01L 29/2003; H01L 29/205; H01L 29/452
See application file for complete search history.

(56) References Cited

U.S. PATENT DOCUMENTS

| | | | | | |
|---|---|---|---|---|---|
| 5,162,243 | A | * | 11/1992 | Streit | H01L 29/207 117/105 |
| 5,357,119 | A | * | 10/1994 | Wang | H01L 27/092 257/18 |

(Continued)

OTHER PUBLICATIONS

A. Saxler et al., Aluminum gallium nitride short-period superlattices doped with magnesium, Applied Physics Letters, Apr. 5, 1999, vol. 74, No. 14, pp. 2023-2025.*

(Continued)

*Primary Examiner* — Victoria K Hall
(74) *Attorney, Agent, or Firm* — Womble Bond Dickinson (US) LLP; Daniel Ovanezian

(57) ABSTRACT

A nitride heterojunction bipolar transistor with one or more polarization-assisted alloy hole-doped short-period superlattice layers are described herein. The transistor may comprise a substrate, a sub-collector region coupled to the substrate, a collector region coupled to the sub-collector portion, a base portion region to the collector portion, and a short-period superlattice (SPSL) emitter region coupled to the base portion. The SPSL emitter includes a plurality of first emitter layers and a plurality of second emitter layers that are alternating layers that form the SPSL emitter. The first emitter layers have a lower bandgap than the second emitter layers, and the vertical transport through the SPSL emitter region occurs via quantum tunneling. Other embodiments are also described.

23 Claims, 6 Drawing Sheets

(51) Int. Cl.
*H01L 29/20* (2006.01)
*H01L 29/45* (2006.01)

(56) References Cited

U.S. PATENT DOCUMENTS

| | | | | |
|---|---|---|---|---|
| 5,604,356 | A * | 2/1997 | Shiraishi | H01L 29/452 257/17 |
| 5,670,798 | A * | 9/1997 | Schetzina | H01L 29/205 257/101 |
| 5,831,277 | A * | 11/1998 | Razeghi | B82Y 20/00 257/103 |
| 5,959,308 | A * | 9/1999 | Shichijo | H01L 21/02381 257/18 |
| 6,118,136 | A * | 9/2000 | Liu | B82Y 10/00 257/17 |
| 8,216,951 | B2 * | 7/2012 | Cheng | B82Y 10/00 257/E21.353 |
| 9,640,616 | B2 * | 5/2017 | Augusto | H01L 29/155 |
| 9,917,155 | B2 * | 3/2018 | Augusto | H01L 29/155 |
| 2004/0031956 | A1 * | 2/2004 | Saxler | H01L 21/02378 257/14 |
| 2004/0201037 | A1 * | 10/2004 | Fareed | H01L 29/66462 257/192 |
| 2005/0167649 | A1 * | 8/2005 | Mears | B82Y 10/00 257/15 |
| 2005/0167653 | A1 * | 8/2005 | Mears | B82Y 10/00 257/18 |
| 2005/0170590 | A1 * | 8/2005 | Mears | B82Y 10/00 438/282 |
| 2005/0170591 | A1 * | 8/2005 | Mears | B82Y 10/00 438/289 |
| 2006/0046458 | A1 * | 3/2006 | Gaska | H01L 21/28575 438/602 |
| 2006/0065952 | A1 * | 3/2006 | Boos | H01L 29/201 257/565 |
| 2008/0073641 | A1 * | 3/2008 | Cheng | B82Y 10/00 257/25 |
| 2012/0119189 | A1 * | 5/2012 | Gaska | H01L 29/452 257/15 |
| 2013/0320403 | A1 * | 12/2013 | Yoder | H01L 29/737 257/197 |
| 2016/0163920 | A1 * | 6/2016 | Atanackovic | H01L 33/325 257/13 |
| 2016/0197146 | A1 * | 7/2016 | Augusto | H01L 29/68 257/22 |

OTHER PUBLICATIONS

H. Cruz & J. Muga, Time-dependent electron tunneling through parabolic quantum wells, Physical Review B, May 15, 1992, vol. 45, No. 20, pp. 11,885-11,889.*

H. Miyake et al., AlGaN/SiC Heterojunction Bipolar Transistors Featuring AlN/GaN Short-Period Superlattice Emitter, IEEE Transactions on Electron Devices, Sep. 2013, vol. 60., No. 9, pp. 2768-2775.*

H. Miyake, Demonstration of SiC Heterojunction Bipolar Transistors with AlN/GaN Short-Period Superlattice Widegap Emitter, 2009, 67th Device Research Conference, Jun. 22-24, 2009, pp. 281-282.*

H. Miyake et al., Demonstration of Common-Emitter Operation in AlGaN/SiC Heterojunction Bipolar Transistors, IEEE Electron Device Letters, Sep. 2010, vol. 31, No. 9, pp. 942-944.*

J. Simon et al., Short-period AlN/GaN p-type superlattices: hole transport use in p-n junctions, Physica Status Solidi, Oct. 2010, vol. 7, No. 10, pp. 2386-2389.*

M. Tsai et al., Low Resistivity GaN-Based Polarization-Induced Tunnel Junctions, Journal of Lightwave Technology, Nov. 2013, vol. 31, No. 22, pp. 3575-3581.*

P. Asbeck et al., InP-based Heterojunction Bipolar Transistors: Performance Status and Circuit Applications, Second Conference on Indium Phosphide and Related Materials, IEEE, Apr. 1990, pp. 2-5.*

P. Kozodoy et al., Polarization-enhanced Mg doping of AlGaN/GaN superlattices, Applied Physics Letters, Oct. 18, 1999, vol. 75, No. 16, pp. 2444-2446.*

R. Gee et al., InP/InGaAs Double Heterojunction Bipolar Transistors Incorporating Carbon-Doped Bases and Superlattice Graded Base-Collector Junctions, Electronics Letters, May 13, 1993, vol. 29, No. 10, p. 850-851.*

P. Kozodoy et al., Enhanced Mg doping efficiency in $Al_{0.2}Ga_{0.8}N$/GaN superlattices, Applied Physics Letters, Jun. 14, 1999, vol. 74, No. 24, pp. 3681-3683.*

H. Cruz, Resonant Tunneling Through Parabolic Quantum Wells Achieved by Means of Short Period Superlattices, Jan. 1993, Solid State Communications, vol. 85, No. 1, pp. 65-68.*

* cited by examiner

NITRIDE HETEROJUNCTION BIPOLAR TRANSISTOR WITH POLARIZATION-ASSISTED ALLOY HOLE-DOPED SHORT-PERIOD SUPERLATTICE EMITTER OR COLLECTOR LAYERS

FIELD

Embodiments of the invention relate generally to Nitride heterojunction bipolar transistors with polarization-assisted alloy hole-doped short-period superlattice emitter or collector layers.

BACKGROUND

Current AlGaInN transistor devices include bipolar junction transistors (BJT) and heterojunction bipolar transistors (HBT). When designing BJTs, to have low power consumption and achieve a high current gain, the forward injection current in BJTs may be maximized while the backward injection current may be minimized. However, this design requires a trade-off between low base resistance and large forward injection current, both of which are desirable for optimum transistor performance.

Using nitride HBT that includes a wider-bandgap material for the emitter region than for the base region may minimize this performance tradeoff. However, both n-p-n and p-n-p HBTs have significant design limitations due to fundamental material properties. The n-p-n HBTs have several issues. The "memory effect" of Mg in the growth reactor when forming the middle p-doped base region makes it difficult to achieve good n-type doping in the upper n-layer. It is also difficult to achieve high p-doping levels in the very thin p-type base layers resulting in high base region resistance. Etching damage when accessing the buried layer causes high contact resistances when forming electrodes. Unlike n-p-n transistors, p-n-p nitride HBTs can have highly conductive base layers, but the choice of bandgap for the emitter and collector is limited by the difficulty of p-doping high Al-containing AlGaN alloys. This limitation severely impacts the accessible performance enhancement of nitride p-n-p HBTs.

In light of the shortcomings of the existing nitride BJTs and HBTs, there is a need for improved p-n-p transistor structures and materials that enable high p-doping of high-bandgap emitter and collector regions.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. In the drawings.

DETAILED DESCRIPTION

In the following description, numerous specific details are set forth. However, it is understood that embodiments of the invention may be practiced without these specific details. In other instances, well-known circuits, structures, and techniques have not been shown to avoid obscuring the understanding of this description.

1. Overview of BJTs and HBTs

Figure 1:
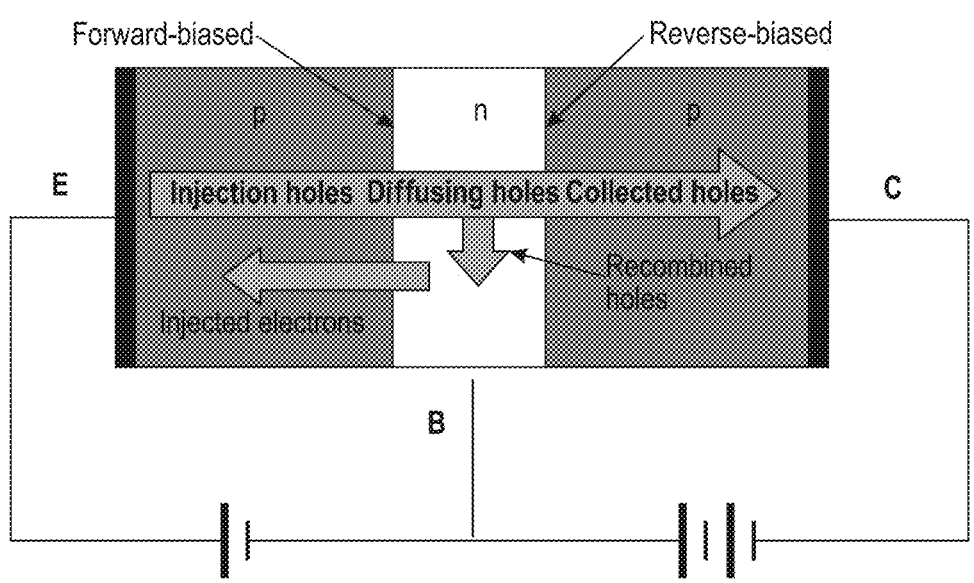
FIG. 1 illustrates a schematic diagram of a p-n-p bipolar junction.

FIG. 1 illustrates a schematic diagram of a p-n-p bipolar junction transistor (BJT) which is a device consisting of a pair of p-n junction diodes that are connected back-to-back. The p-n-p BJT includes an emitter region (E), a collector region (C) doped with the same polarity type, and a thin base region with an opposite doping polarity inserted between the emitter region and the collector region.

Under a forward bias condition between base region (B) and emitter region (E), and a reverse bias condition between base region (B) and collector region (C), holes diffuse into base region, while electrons from the base is injected into emitter region (E). The main driving force for hole diffusion is a minority carrier concentration gradient in the base region (B), as the minority carrier concentration in the base-emitter interface region is higher than that of the base-collector interface region. A small portion of the diffused holes recombine with electrons injected via the contact to base region (B) (base-contact). Hence, the thickness of the base region (B) should be thinner than the diffusion length of the minority carrier so the minority carrier from the emitter region can diffuse into the collector region within the minority carrier lifetime.

BJTs have many advantages. For instance, BJTs have a vertical device structure, where the key dimension that determines carrier transit time is the thickness of the epitaxial layer. This thickness can be more easily controlled to a much smaller dimension than can be achieved in lateral devices via lithography. As a result, the high frequency performance of BJTs is less sensitive to the device processing than, for example, corresponding heterojunction field effect transistors (HFETs).

BJTs also have a much higher current handling capability per unit device area than HFETs because the current flows across a two-dimensional area, as opposed to a thin channel layer in HFETs. Moreover, breakdown mechanism for BJTs is determined by the bulk effects, and it is not dominated by surface traps, surface treatment, or device processing. The switching characteristic of BJTs is also more linear than the field-effect devices.

Figure 2:
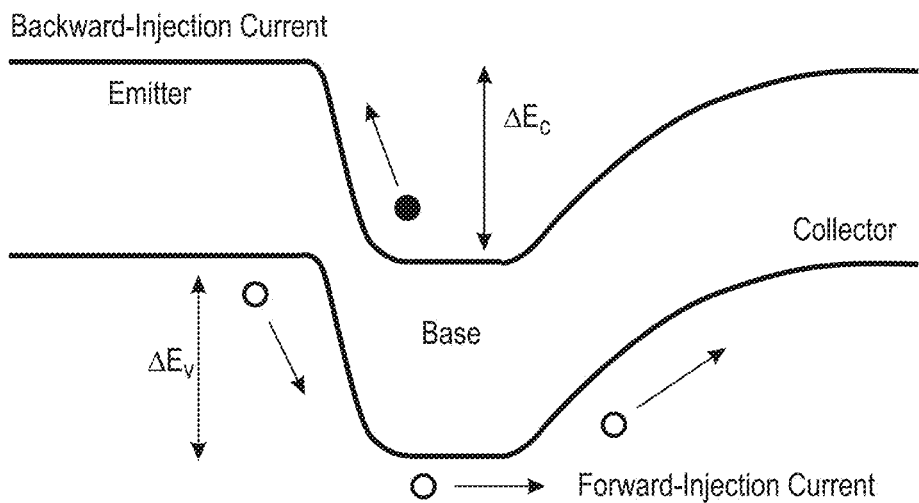
FIG. 2 illustrates an energy band structure of a homojunction p-n-p BJT under neutral conditions with different current components.

To have low power consumption and achieve a high current gain, the forward injection current in BJTs may be maximized while the backward injection current may be minimized. In FIG. 2, an energy band structure of a homo-junction p-n-p BJT under neutral conditions with different current components is shown. Referring to FIG. 2, higher forward injection current may be achieved by doping the emitter region at a higher concentration than the base region. However, such a design leads to high base resistance and high base-emitter capacitance. The resistance of the base layer and the base-emitter capacitance can be reduced by increasing the base doping concentration. Doing so would reduce the forward injection current relative to the backward injection current. Hence, there exists a trade-off between low base resistance and high forward injection current, both of which are desirable for optimum transistor performance.

Figure 3:
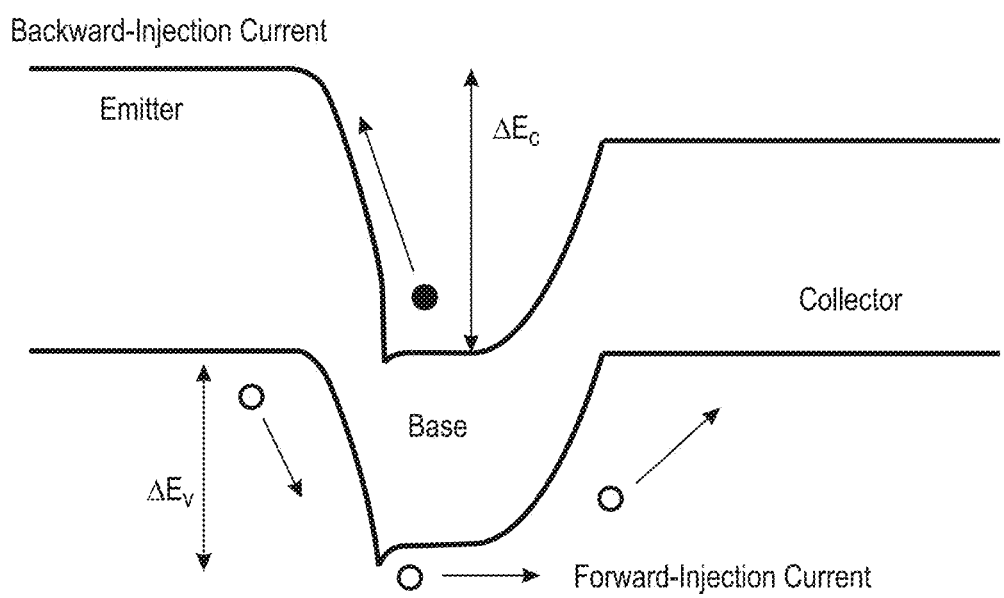
FIG. 3 illustrates an energy band structure of a p-n-p heterojunction bipolar transistor (HBT) under neutral conditions utilizing a wider bandgap material at the emitter.

Using a heterojunction bipolar transistor (HBT) that includes a wider-bandgap material for the emitter region than for the base region may minimize this performance tradeoff. In FIG. 3, an energy band structure of a p-n-p HBT under neutral conditions utilizing a wider bandgap material at the emitter region is illustrated. As shown in FIG. 3, the wide bandgap at the emitter region increases conduction band offset ($\Delta Ec$) between emitter region and the base region, leading to reduced backward injection current without reducing the valence band offset ($\Delta Ev$). Thus, with this extra design parameter, the base doping level can be increased without significantly increasing the backward injection current, and a low base resistance and a high forward to backward current injection ratio can be simultaneously achieved. The HBT structure thus allows improved device performance and more flexible device design.

The III-Nitride materials are advantageous materials for high-performance HBTs because of their wide bandgap and thermal and chemical stability. In III-nitride HBTs, n-p-n HBTs typically consist of n-type gallium nitride (GaN), p-type indium gallium nitride (InGaN), n-type GaN. The device structure may be motivated by the relatively high p-type doping efficiency of InGaN and by the better stability of the InGaN base region against process etching damage.

However, n-p-n GaN/InGaN HBTs have several issues. First, the base region needs to be highly doped for low base resistance, but the large amount of Magnesium (Mg) flow during device growth leads to a "memory effect." The "memory effect" is whereby Mg residues in the reactor prevent the subsequent emitter region to be n-type doped within the same growth process. As a result, a re-growth step is usually required to realize n-p-n devices. Second, it is difficult to achieve high average doping levels in very thin p-type base layers because of delay between Mg gas flow and its incorporation into the film being grown. The resulting p-doping profile in very thin layers usually rises gradually, where a substantial portion has low doping. Third, the mobility of holes is very low, so thin p-type base region which is required for good collection of injected electron would result in a high base region resistance. Fourth, the p-type base region is especially susceptible to etching damage leading to high contact resistances when forming electrodes. Choice of InGaN as a base material for better p-doping efficiency compared to GaN or aluminum gallium nitride (AlGaN) also places a limit on the attainable band offset $\Delta Ec$. The Indium (In) composition cannot be made too high because of V-defects formation in InGaN with high In molar fraction.

P-n-p HBTs address some key issues related to n-p-n transistors. P-n-p HBTs may include p-type AlGaN/n-type GaN/p-type AlGaN or GaN. In one example p-n-p HBT, the base region thickness may typically be less than 250 nm because the hole diffusion length in heavily doped n-type GaN is about 250 nm. Although thinner base regions enable better collection of injected holes through the base region, a thin base region also increases base resistance. Therefore, there is a performance trade-off when selecting the base region thickness. Typical base region thicknesses are about 30-50 nm.

For example, one example p-n-p HBT may include:

| Region in the p-n-p HBT | Content | Thickness |
|---|---|---|
| Emitter | 20% AlGaN:Mg | 50 nm |
| Base | GaN:Si | 30-50 nm |
| Collector | AlGaN: Mg or GaN | 0.8 μm |
| Sub-Collector | 10% AlGaN | 1 μm |
| Substrate | Sapphire, Si, GaN, AN, or SiC. | |

One of the biggest advantages of AlGaN/GaN p-n-p HBTs is the ability to realize a highly doped high quality n-type base region because of its simple binary alloy composition. The high base doping concentration results in low base and contact resistances. The improved electrical characteristics also allow the possibility of using ultra-thin base designs that could lead to improved high frequency characteristics.

A higher band offset $\Delta Ec$ compared to n-p-n HBTs can be achieved by simply selecting high aluminum (Al) compositions in the AlGaN emitter region and collector region. The allowable Al composition in p-n-p HBTs may accommodate a higher band offset than the allowable In composition in n-p-n HBTs.

To achieve a large energy band offset at the emitter-base interface, it is beneficial to use a high Al molar fraction for the AlGaN alloy at the emitter region. Unfortunately, the activation energy for Mg hole doping is very high in AlGaN, and hole doping becomes increasingly difficult at high Al molar fractions, causing high resistance in the emitter region.

In the example p-n-p HBT described in the table above, the p-type AlGaN sub-collector suffers from low Mg doping efficiency, and its impact on the overall device resistance is significant because the carrier travel distance in the sub-collector is long. It is noted that use of higher Mg flow rate may relieve this issue, but it also causes degrades the electrical properties of the n-type base due to Mg memory effect during epitaxial growth.

2. Transistors Including SPSL Structures in Accordance with Embodiments of the Invention In light of the advantages and disadvantages of the BJTs and HBTs discussed above, embodiments of the invention include transistors that are p-n-p HBT and include one or more short-period superlattice (SPSL) structures at the emitter region and/or collector and sub-collector regions. The SPSL structures included in embodiments of the invention are a design architecture that takes advantage of the built-in polarization fields in nitride semiconductors to create holes. In embodiments of the invention, holes are created not only through conventional thermal activation but also by means of polarization electric fields resulting from bandgap engineering of the short period superlattice layers.

The SPSL structures at the emitter and/or collector and sub-collector regions of the transistor in some embodiments of the invention are designed so that the engineered electric field profile within the structure promotes hole activation even under a smaller Mg flow rate, while ensuring that the alloy fluctuation does not interfere with hole transport. In one embodiment, the SPSL structures are p-AlGaN structures with engineered varying alloy composition across the structure.

Figure 7:
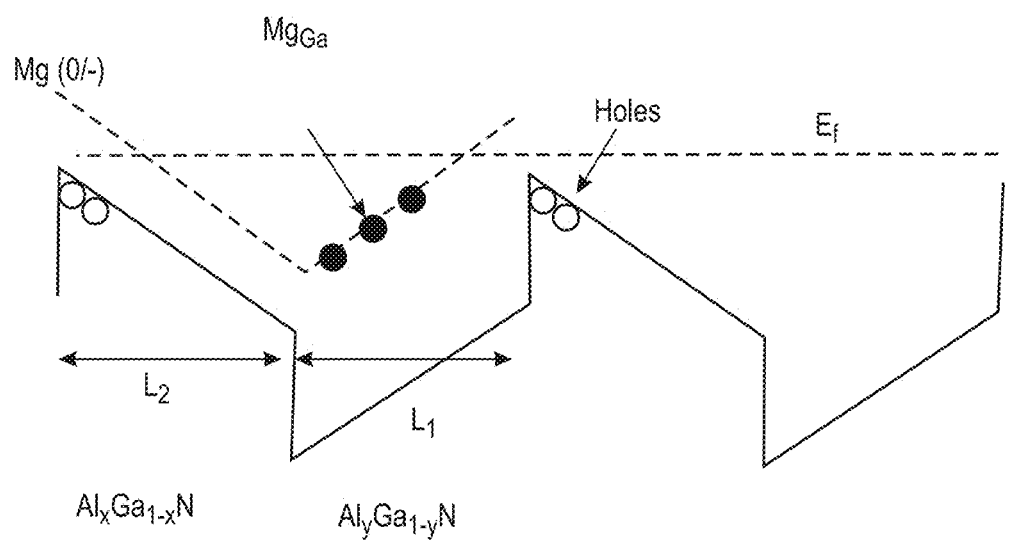
FIG. 7 is an energy band diagram of a short period superlattice designed to enhance hole doping in accordance to one embodiment.

Referring to FIG. 7, an energy band diagram of a short period superlattice (SPSL) designed to enhance hole doping in accordance to one embodiment is illustrated. In one embodiment, the superlattice is ultra-thin (e.g., less than one monolayer of the alloy crystal lattice thick). In FIG. 7, the energy levels for hole activation are indicated as dotted lines. The polarization fields in the material enhance the ionization of Mg atoms at the high bandgap regions of the superlattice to produce holes. Once created, the holes migrate to the low bandgap sections of the superlattice. Vertical transport through the superlattice occurs via quantum tunneling. In FIG. 7, the slope represents the electric field and the $L_1$ is one of the first layers and the $L_2$ is one of the second layers. The first layers $L_1$ have a lower bandgap than the second layers $L_2$.

Figure 4:
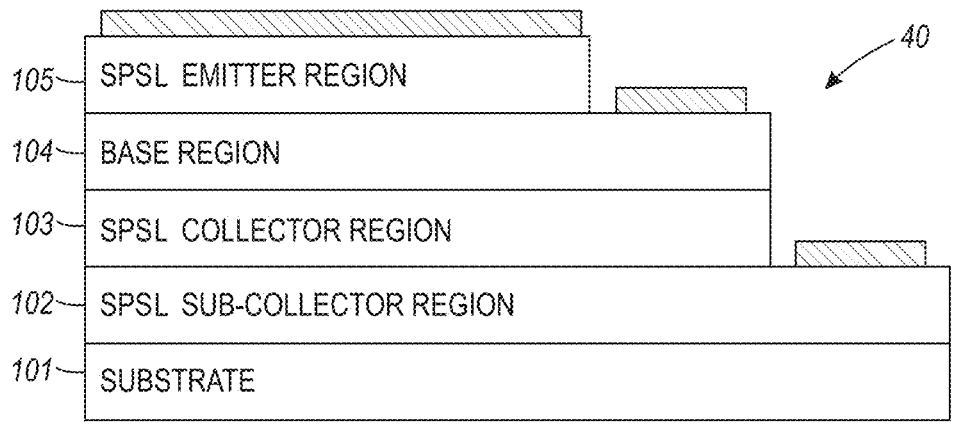
FIG. 4 illustrates a transistor in accordance with a first embodiment of the invention.
Figure 5:
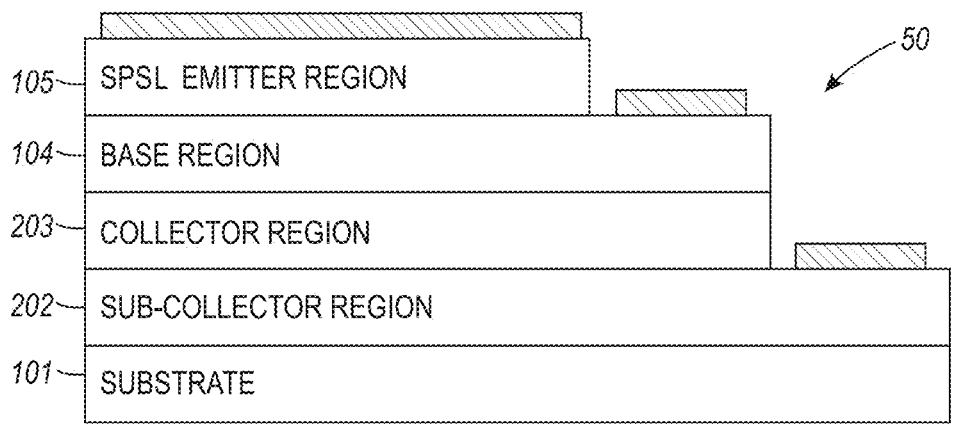
FIG. 5 illustrates a transistor in accordance with a second embodiment of the invention.
Figure 6:
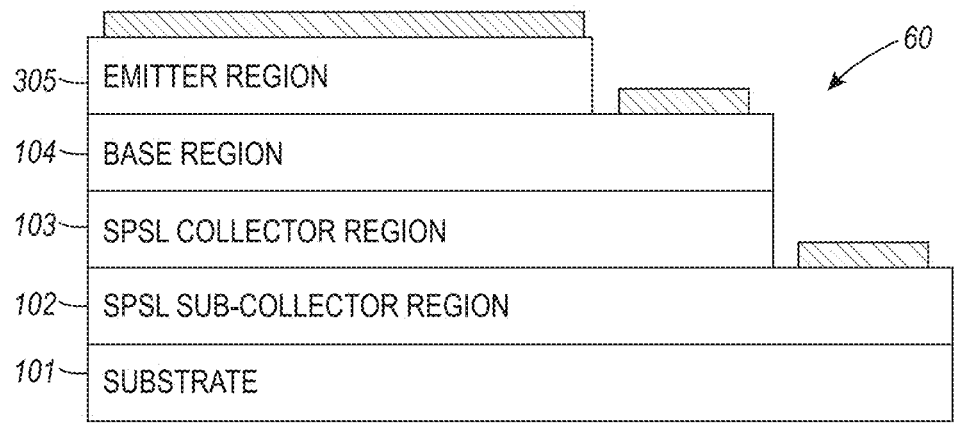
FIG. 6 illustrates a transistor in accordance with a third embodiment of the invention.

FIGS. 4-6 illustrate transistors 40, 50, and 60 in accordance with different embodiments of the invention. In FIGS. 4-6, the transistors 40, 50, and 60 may be heterojunction bipolar transistors.

FIG. 4 illustrates a transistor 40 in accordance with a first embodiment of the invention. As shown in FIG. 4, the transistor 40 includes a substrate 101, a SPSL sub-collector region 102, a SPSL collector region 103, a base region 104, and a SPSL emitter region 105. In one embodiment, the transistor 40 may be a p-n-p GaN HBT utilizing polarization-assisted hole doping at the emitter 105 and collector 103 and subcollector 102 regions.

The substrate 101 may be made of, for instance, sapphire, silicon carbine (SiC), silicon (Si), Aluminum Nitride (AlN) or Gallium Nitride (GaN). The SPSL sub-collector region 102 is coupled to the substrate 101 and formed thereon. The collector region 103 is coupled to the sub-collector region 102 and formed thereon. The combined region that includes the sub-collector region 102 and the collector region 103 may be 400 nm thick.

The SPSL sub-collector region 102 includes a plurality of first sub-collector layers and a plurality of second sub-collector layers. In one embodiment, first sub-collector layers and second sub-collector layers are respectively 1 nm GaN and 1 nm $Al_{0.4}Ga_{0.6}N$. The first sub-collector layers and the second sub-collector layers form a plurality of pairs (e.g., 100 pairs) to form shortperiod superlattice structure with an average Al composition of 20%. In other words, the first sub-collector layers and the second sub-collector layers are alternating layers forming the SPSL sub-collector region 102. The first sub-collector layers may have a lower bandgap than the second sub-collector layers. In one embodiment, first sub-collector layers are more heavily doped than the second sub-collector layers. In one embodiment, an alloy composition of the first sub-collector layers are different than an alloy composition of the second sub-collector layers. In one embodiment, the thickness of each of the first sub-collector layers is different from a thickness of each of the second sub-collector layers. In another embodiment, the thickness of each of the first sub-collector layers is the same as a thickness of each of the second sub-collector layers.

In one embodiment, the SPSL sub-collector region 102 is p-AlGaN and the hole concentration (or doping concentration) may be approximately $5\times10^{17}$ cm$^{-3}$. The SPSL sub-collector region 102 may provide for excellent lateral connectivity. This improved lateral conductivity results from quantum mechanical transport properties associated with the two-dimensional hole gas confined within the superlattice structure (e.g., SPSL regions). Thus, in addition to increasing the hole concentration via polarization field-assisted Mg activation, the SPSL structures also enhance lateral conductivity.

Referring back to FIG. 4, the SPSL collector region 103 may be coupled to the SPSL sub-collector region 102. Similarly to the SPSL sub-collector region 102, the SPSL collector region includes a plurality of first collector layers and a plurality of second collector layers. In one embodiment, first collector layers and second collector layers are respectively 1 nm GaN and 1 nm $Al_{0.4}Ga_{0.6}N$. The first collector layers and the second collector layers form a plurality of pairs (e.g., 100 pairs) to form shortperiod superlattice structure with an average Al composition of 20%. In other words, the first collector layers and the second collector layers are alternating layers forming the SPSL collector region 103. The first collector layers may have a lower bandgap than the second collector layers. In one embodiment, the first collector layers are more heavily doped than the second collector layers. In one embodiment, an alloy composition of the first collector layers are different than an alloy composition of the second collector layers. In one embodiment, the SPSL collector region 103 may be p-AlGaN and have a hole concentration (or doping concentration) of approximately $5\times10^{17}$ cm$^{-3}$. In one embodiment, the vertical transport through the SPSL sub-collector region 102 and the SPSL collector region 103 occurs via quantum tunneling. The SPSL sub-collector region 102 thickness may be 1.2 μm, and the SPSL collector region 103 thickness may be 0.5 μm. In one embodiment, the thickness of each of the first collector layers is different from a thickness of each of the second collector layers. In another embodiment, the thickness of each of the first collector layers is the same as a thickness of each of the second collector layers.

The SPSL sub-collector region 102 and the SPSL collector region 103 are superlattice structures that also lead to lower electrical contact resistance when forming ohmic contacts with external metal electrodes. It is much easier to form good ohmic contact with p-GaN than with p-AlGaN. Since the etched contact surfaces of the SPSL sub-collector region 102 and the SPSL emitter region 105 will have a mixture of GaN and AlGaN, any metal deposited on the surface (e.g., contacts illustrated in dashed lines in FIGS. 4-6) will contact some GaN. These GaN-contacted areas will exhibit low contact resistance and lead to lower overall device contact resistance. The superlattice structure also helps to improve electrical performance of n-type base layer. Smaller Mg flow rate that is required to achieve similar or higher hole concentration in superlattice structure compared to homogeneous AlGaN layer minimizes Mg memory effect and reduces degradation of electrical performance of n-type base.

In FIG. 4, a base region 104 is coupled to the collector region 103. The base region 104 may include GaN and Si (GaN:Si) and may have a hole concentration (or doping concentration) of approximately $5\times10^{18}$ cm$^{-3}$. In one embodiment, the thickness of the base region 104 is 30 nm.

The SPSL emitter region 105 may be coupled to the base region 104. In one embodiment, the SPSL emitter region 105 may be p-AlGaN and may have a hole concentration (or doping concentration) of approximately $1\times10^{17}$ cm$^{-3}$. The SPSL emitter region 104 may provide for excellent vertical conductivity. In one embodiment, the SPSL emitter region 105 is a 50-nm thick.

Similar to the SPSL collector region 103 and SPSL sub-collector region 102, the SPSL emitter region 105 includes a plurality of first emitter layers and a plurality of second emitter layers. Each of the first emitter layers and each of the second emitter layers may respectively be 1 nm AN and 1 nm GaN. For example, each of the first emitter layers and each of the second emitter layers may respectively be 1 nm $Al_{0.25}Ga_{0.75}N$ and 1 nm $Al_{0.75}Ga_{0.25}N$. In one embodiment, the first and second emitter layers have large bandgap contrasts to realize the high polarization fields needed for ionizing dopants. In one embodiment, the first emitter layers are more heavily doped than the second emitter layers. In one embodiment, an alloy composition of the first emitter layers is different than an alloy composition of the second emitter layers. The first emitter layers and the second emitter layers are alternating layers forming the SPSL emitter region 105. The vertical transport through the SPSL emitter region 105 occurs via quantum tunneling.

In one embodiment, the thickness of each of the first emitter layers is different from a thickness of each of the second emitter layers. In another embodiment, the thickness of each of the first emitter layers is the same as a thickness of each of the second emitter layers.

The SPSL emitter region 105 may have an average Al composition of 50%. In one embodiment, the SPSL emitter region 105 may include first emitter layers that includes 74% Al composition and second emitter layers that include 49% Al composition. In one embodiment, the E-B conduction band offset may be larger.

In the embodiments shown in FIGS. 4-6, the individual layer thicknesses in the superlattice regions (e.g., SPSL emitter 105, SPSL sub-collector 102, SPSL collector 103) may vary but should remain thin (e.g., in the order of 1 nm). In one embodiment, layer thicknesses that are less than 1 nm are preferred. The period of the short period superlattice regions (e.g., SPSL emitter 105, SPSL sub-collector 102, SPSL collector 103) may be shorter than the De Broglie wavelength of holes in the material. In some embodiments, the doping profile would be modulated so that the low bandgap layers in the superlattice are more heavily doped than the high bandgap layers.

FIG. 5 illustrates a transistor 50 in accordance with a second embodiment of the invention. Similar to the transistor 40 in FIG. 4, transistor 50 includes the substrate 101, the base region 104 and the SPSL emitter region 105. However, transistor 50 includes a sub-collector region 202 and a collector region 203 in lieu of the SPSL collector region 102 and a SPSL collector region 103 in transistor 40. In this embodiment in FIG. 5, the AlGaN composition of the sub-collector and collector regions 202, 203 may have low Al content instead of being SPSL structures. In some implementations, a single (or simple homogeneous) $Al_xGa_{1-x}N$ layer may be used as the sub-collector and collector regions 102, 103.

FIG. 6 illustrates a transistor 60 in accordance with a third embodiment of the invention. Similar to the transistor 40 in FIG. 4, the transistor 60 includes the substrate 101, SPSL sub-collector region 102, the SPSL collector region 103, and the base region 104. However, in this embodiment, the transistor 60 includes the emitter region 305 which is not a SPSL structure. In this embodiment, the emitter region 305 may be single p-AlGaN and have an Al composition of about 30 to 50%.

While not illustrated, it is contemplated that, in some embodiments, the transistors 40, 60 as illustrated in FIGS. 4 and 6 may not include a SPSL sub-collector region 102 such that the SPSL collector region 103 is coupled to the substrate 101. Similarly, in one embodiment, the transistor 50 in FIG. 5 may not include the sub-collector 202 region such that the collector region 203 is coupled to the substrate 101.

In some embodiments, the SPSL sub-collector region 103, the SPSL collector region 102, and/or the SPSL emitter region 105 in FIGS. 4-6 may include dissimilar layer pairs. For example, the SPSL collector region 102 may include a plurality of layer pairs to form the SPSL structure. Each pair may comprise a first collector layer having a lower bandgap material than a second collector layer. In one embodiment, at least some of the layer pairs of the SPSL are identical. In this embodiment, some of the layer pairs of the SPSL are dissimilar.

In one embodiment, at least one of the first or second layer within at least one of the SPSL layer (e.g., SPSL sub-collector region 103, the SPSL collector region 102, and/or the SPSL emitter region 105 in FIGS. 4-6) has a thickness of less than 1 monolayer of the crystal lattice constant.

Figure 8:
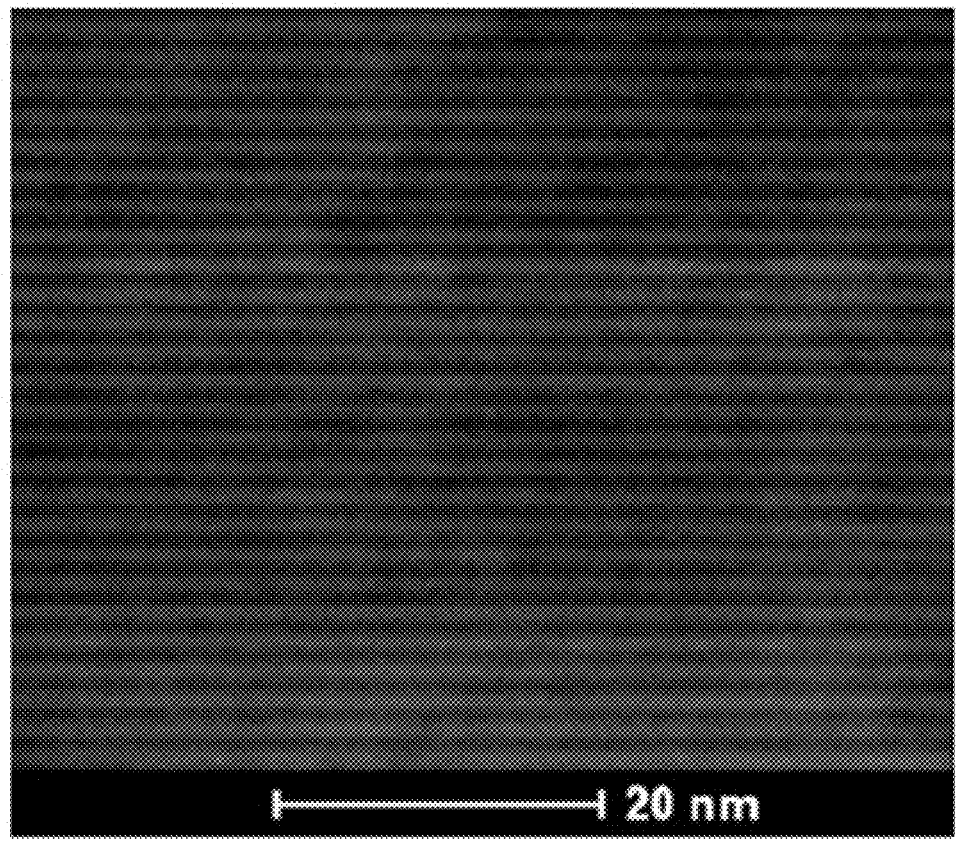
FIG. 8 is a cross section scanning transmission electron micrograph (STEM) of a Metal Organic Chemical Vapor Deposition (MOCVD)-grown short period superlattice (SPSL) designed for polarization-assisted hole doping in accordance to one embodiment.

FIG. 8 is a cross section scanning transmission electron micrograph (STEM) of a Metal Organic Chemical Vapor Deposition (MOCVD)-grown short period superlattice (SPSL) designed for polarization-assisted hole doping in accordance to one embodiment.

Specifically, FIG. 8 shows a cross section STEM of a Mg-doped $Al_{0.74}Ga_{0.26}N/Al_{0.49}Ga_{0.51}N$ SPSL structure that is designed for polarization-assisted doping. The layers are grown by MOCVD. The individual first and second layers in the SPSL structure that are alternating in FIG. 8 may be about 0.7 nm and 0.8 nm thick, respectively.

Figure 9A:
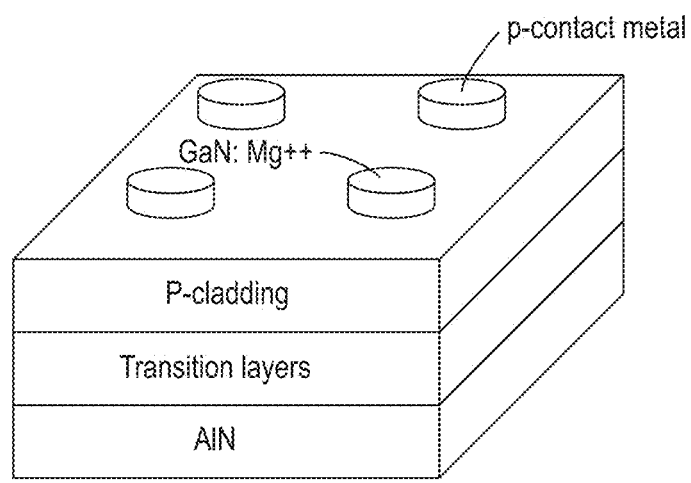
FIG. 9A is an exemplary diagram of a structure used to evaluate the lateral transport characteristics of different p-SPSL designs in accordance to one embodiment.

FIG. 9A is an exemplary diagram of a structure used to evaluate the lateral transport characteristics of different p-SPSL designs in accordance to one embodiment. The structure in FIG. 9A is a test structure. The structure includes p-contacts (e.g., Pd contacts) formed on a p-GaN contact layer grown above a p-AlGaN/AlGaN short-period superlattice regions (e.g., SPSL emitter 105, SPSL sub-collector 102, SPSL collector 103). As discussed above, the superlattice regions (e.g., SPSL emitter 105, SPSL sub-collector 102, SPSL collector 103) enhance p-doping via engineered built-in polarization fields. In one embodiment, the contacts were arranged in a Van der Pauw geometry for Hall Effect characterization. After forming the metal p-contact, in some embodiments, the GaN cap material at regions between the contacts is etched away to ensure that any induced electrical current during materials testing flows only through the superlattice region.

Figure 9B:
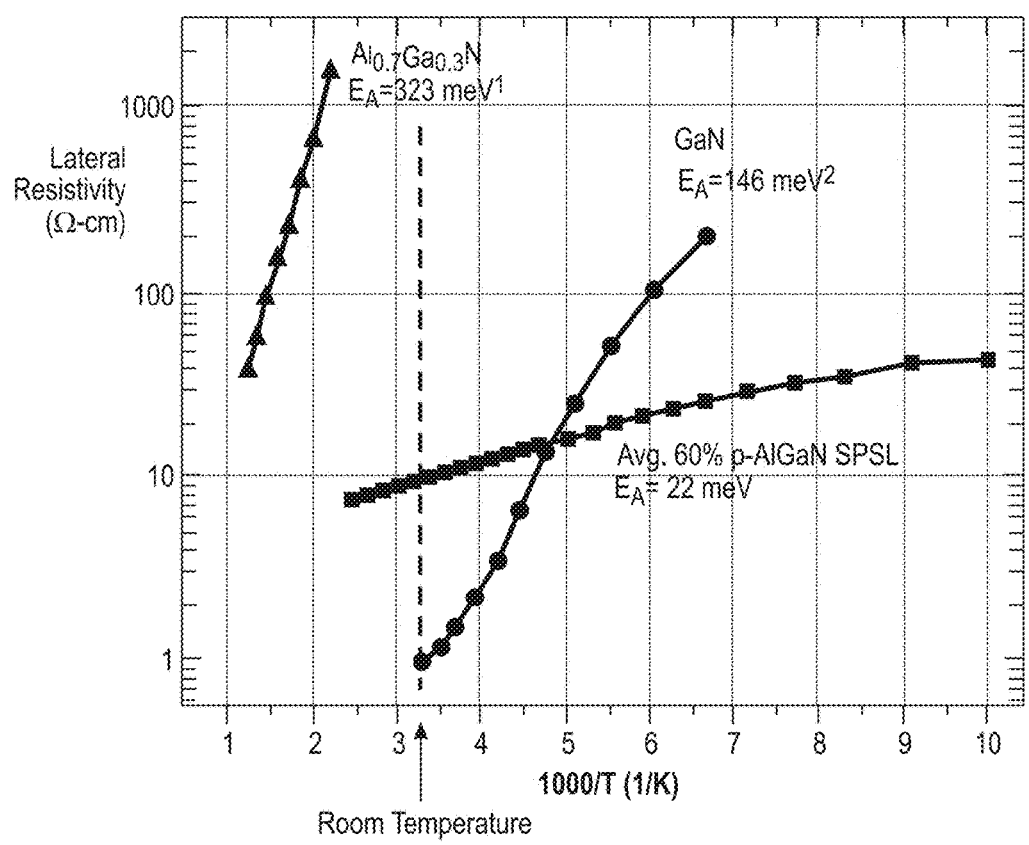
FIG. 9B is a graph illustrating the lateral resistivity of a p-SPSL in accordance with one embodiment of the invention and prior art p-layers with respect to temperature.

Using the characteristic behavior shown in FIG. 9B, the electrical characteristics of our superlattice hole transport design is compared to that of an equivalent homogeneous p-AlGaN layer having an Al composition equal to the average composition of the superlattice. The results of this comparison are shown in FIG. 9B which is a graph illustrating the lateral resistivity of a transistor in accordance with the one embodiment of the invention and prior art transistors with respect to temperature. In FIG. 9B, the p-AlGaN resistivities are shown to be a function of temperature.

In FIG. 9B, when comparing the lateral resistivities with respect to temperature for (1) the homogeneous p-AlGaN (e.g., $Al_{0.7}Ga_{0.3}N$) and (2) the p-GaN, it is shown that both the p-GaN and the homogeneous p-AlGaN exhibit sharp increases in electrical resistivities as the temperature is reduced. This behavior is typical and is characteristic of conventional thermal activation of holes in nitride semiconductors.

In contrast, FIG. 9B shows that the electrical resistivity of our p-cladding superlattice layers (e.g., the p-SPSL heterostructure having an Al molar fraction of 74% (0.7 nm thick)/49% (0.9 nm-thick) which is an average Al composition is 60%) has a nearly a-thermal behavior. This weak temperature dependence compared to that of bulk structures indicates that the polarization-induced dopant ionization mechanism works in the embodiments of the invention, and that this electric field dopant activation mechanism dominates over the usual thermal ionization process. The hole activation energy of our superlattice sample is only 22 meV, compared to 323 meV for homogeneous p-$Al_{0.7}Ga_{0.3}N$ and 146 meV for p-GaN. Additionally, our p-superlattice design exhibits a low electrical resistivity of about 10 Ω-cm at room temperature.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting. There are numerous other variations to different aspects of the invention described above, which in the interest of conciseness have not been provided in detail. Accordingly, other embodiments are within the scope of the claims.

What is claimed is:

1. A transistor comprising:
   a substrate;
   a sub-collector region coupled to the substrate;
   a collector region coupled to the sub-collector region;
   a base region coupled to the collector region; and
   a short-period superlattice (SPSL) emitter region coupled to the base region,
      wherein the SPSL emitter region includes a plurality of first emitter layers and a plurality of second emitter layers,
      wherein the first emitter layers and the second emitter layers are alternating layers forming the SPSL emitter region,
      wherein the first emitter layers have a lower bandgap than the second emitter layers,
   wherein vertical transport through the SPSL emitter region occurs via quantum tunneling,
   wherein the sub-collector region is a SPSL sub-collector region that includes a plurality of first sub-collector layers and a plurality of second sub-collector layers,
   wherein the first sub-collector layers and the second sub-collector layers are alternating layers forming the SPSL sub-collector region,
   wherein the first sub-collector layers have a lower bandgap than the second sub-collector layers; and
   wherein the collector region is a SPSL collector region that includes a plurality of first collector layers and a plurality of second collector layers,
   wherein the first collector layers and the second collector layers are alternating layers forming the SPSL collector region,
   wherein the first collector layers have a lower bandgap than the second collector layers,
   wherein vertical transport through the SPSL sub-collector region and the SPSL collector region occurs via quantum tunneling.

2. The transistor in claim 1, wherein the first emitter layers are more heavily doped than the second emitter layers.

3. The transistor in claim 1, wherein an alloy composition of the first emitter layers is different than an alloy composition of the second emitter layers.

4. The transistor in claim 1, wherein a thickness of each of the first emitter layers is different from or same as a thickness of each of the second emitter layers.

5. The transistor in claim 1, wherein the first sub-collector layers are more heavily doped than the second sub-collector layers, and the first collector layers are more heavily doped than the second collector layers.

6. The transistor in claim 1, wherein an alloy composition of the first sub-collector layers is different than an alloy composition of the second sub-collector layers, and wherein an alloy composition of the first collector layers is different than an alloy composition of the second collector layers.

7. The transistor in claim 1, wherein a thickness of each of the first sub-collector layers is different from or same as a thickness of each of the second sub-collector layers, and wherein a thickness of each of the first collector layers is different from or same as a thickness of each of the second collector layers.

8. The transistor in claim 1, wherein the transistor is a heterojunction bipolar transistor.

9. A transistor comprising:
   a substrate;
   a short-period superlattice (SPSL) sub-collector region coupled to the substrate,
      wherein the SPSL sub-collector region includes a plurality of first sub-collector layers and a plurality of second sub-collector layers,
      wherein the first sub-collector layers and the second sub-collector layers are alternating layers forming the SPSL sub-collector region,
      wherein the first sub-collector layers have a lower bandgap than the second sub-collector layers;
   a SPSL collector region coupled to the SPSL sub-collector region,
      wherein the SPSL collector region includes a plurality of first collector layers and a plurality of second collector layers,
      wherein the first collector layers and the second collector layers are alternating layers forming the SPSL collector region,
      wherein the first collector layers have a lower bandgap than the second collector layers,
      wherein vertical transport through the SPSL sub-collector region and the SPSL collector region occurs via quantum tunneling;
   a base region coupled to the SPSL collector region; and
   an emitter region coupled to the base region.

10. The transistor in claim 9, wherein the first sub-collector layers are more heavily doped than the second sub-collector layers, and the first collector layers are more heavily doped than the second collector layers.

11. The transistor in claim 9, wherein an alloy composition of the first sub-collector layers is different than an alloy composition of the second sub-collector layers, and wherein an alloy composition of the first collector layers is different than an alloy composition of the second collector layers.

12. The transistor in claim 9, wherein a thickness of each of the first sub-collector layers is different from or same as a thickness of each of the second sub-collector layers, and wherein a thickness of each of the first collector layers is different from or same as a thickness of each of the second collector layers.

13. The transistor in claim 9, wherein the transistor is a heterojunction bipolar transistor.

14. A transistor comprising:
   a substrate;
   a short-period superlattice (SPSL) sub-collector region coupled to the substrate, wherein the SPSL sub-collector region includes a plurality of first sub-collector layers and a plurality of second sub-collector layers,
wherein the first sub-collector layers and the second sub-collector layers are alternating layers forming the SPSL sub-collector region,
a SPSL collector region coupled to the SPSL sub-collector region,
wherein the SPSL collector region includes a plurality of first collector layers and a plurality of second collector layers,
wherein the first collector layers and the second collector layers are alternating layers forming the SPSL collector region,
wherein vertical transport through the SPSL sub-collector region and the SPSL collector region occurs via quantum tunneling;
a base region coupled to the SPSL collector region; and
a SPSL emitter region coupled to the base region,
wherein the SPSL emitter region includes a plurality of first emitter layers and a plurality of second emitter layers,
wherein the first emitter layers and the second emitter layers are alternating layers forming the SPSL emitter region,
wherein vertical transport through the SPSL emitter region occurs via quantum tunneling.

15. The transistor in claim 14,
wherein an alloy composition of the first emitter layers is different than an alloy composition of the second emitter layers, and
wherein an alloy composition of the first sub-collector layers is different than an alloy composition of the second sub-collector layers, and wherein an alloy composition of the first collector layers is different than an alloy composition of the second collector layers.

16. The transistor in claim 14,
wherein the first emitter layers are more heavily doped than the second emitter layers, and
wherein the first sub-collector layers are more heavily doped than the second sub-collector layers, and the first collector layers are more heavily doped than the second collector layers.

17. A transistor comprising:
a substrate;
a collector region;
a base region coupled to the collector region; and
an emitter region coupled to the base region;
wherein at least a portion of at least one of the collector region or emitter region comprises a short-period-superlattice (SPSL);
wherein the SPSL includes a plurality of layer pairs, each pair comprising a first layer having a lower bandgap material than a second layer, wherein the SPSL has nearly a-thermal lateral resistivity characteristics.

18. The transistor of claim 17, wherein at least some of the layer pairs of the SPSL are identical.

19. The transistor of claim 17, wherein the second layer within one layer pair of the SPSL layer has a thickness of less than 1 monolayer of a crystal lattice constant.

20. The transistor of claim 17, further comprising a sub-collector region coupled to the collector region and to the base region, wherein the collector region and the sub-collector region are SPSL.

21. The transistor of claim 17, wherein the emitter region and the collector region are SPSL.

22. The transistor of claim 17, wherein the doping concentration of the base region is higher than an average doping concentration of the emitter region.

23. The transistor of claim 22, wherein a forward injection current in the transistor is higher than a backward injection current in the transistor.

* * * * *